(12) United States Patent
Thomas

(10) Patent No.: US 7,868,275 B2
(45) Date of Patent: Jan. 11, 2011

(54) SWITCHING CIRCUIT CONTROLLING MULTIPLE HEATING ELEMENTS

(75) Inventor: Adrian Mark Thomas, Bicester (GB)

(73) Assignee: Siemens Plc, Frimley, Camberley (GB)

( * ) Notice: Subject to any disclaimer, the term of this patent is extended or adjusted under 35 U.S.C. 154(b) by 1087 days.

(21) Appl. No.: 11/589,852

(22) Filed: Oct. 31, 2006

(65) Prior Publication Data
US 2007/0102422 A1 May 10, 2007

(30) Foreign Application Priority Data
Nov. 4, 2005 (GB) ................................. 0522513.1

(51) Int. Cl.
H05B 6/06 (2006.01)
(52) U.S. Cl. .......................... 219/770; 219/626; 363/49
(58) Field of Classification Search ................ 219/770, 219/661, 626, 670, 664, 665; 323/210, 255; 363/136, 16, 21.08, 21.2, 97; 178/18.07, 178/19.03, 20.02
See application file for complete search history.

(56) References Cited

U.S. PATENT DOCUMENTS 4,370,703 A * 1/1983 Risberg ..................... 363/136
5,594,215 A * 1/1997 Jeng ......................... 178/18.07
6,958,898 B2 10/2005 Ries et al.

FOREIGN PATENT DOCUMENTS

| CN | 1363937 A | 8/2002 |
| GB | 442283 A | 7/1934 |
| GB | 577169 A | 5/1942 |
| WO | WO 2005/050585 A1 | 6/2005 |

OTHER PUBLICATIONS

Office Action in Chinese Patent Application No. 200610143291.5 dated May 10, 2010.

* cited by examiner

Primary Examiner—Quang T Van
(74) Attorney, Agent, or Firm—Crowell & Moring LLP

(57) ABSTRACT

A switching circuit including a plurality of heating elements (12), each connected as part of a tuned circuit (36), the tuned circuits being respectively tuned to different frequencies and connected in parallel between two common conductors (34), the circuit further including a device (20, 38, 40) for applying an oscillating signal voltage between the two common conductors, at one or more frequencies each corresponding to a tuned frequency of one of the tuned circuits.

7 Claims, 2 Drawing Sheets

SWITCHING CIRCUIT CONTROLLING MULTIPLE HEATING ELEMENTS

The present invention relates to switching circuits for controlling multiple heating elements. It particularly relates to switching circuits for use in cryostats housing superconducting magnet coils, such as employed for example in Nuclear Magnetic Resonance (NMR) or Magnetic Resonance Imaging (MRI) systems, particle accelerators, energy storage, X-ray sources and semiconductor etching.

Such cryogenically cooled superconducting systems typically include a number of heaters, provided to heat specific parts of superconducting components above their critical temperature, to return them to a normal resistive state. Such heaters may be used to turn off the current in a superconducting coil, when the magnetic field produced is no longer required. This may apply to the main field coils of a system, or to smaller shim coils which act to increase the homogeneity of the overall field. Such heaters are also used to initiate quench in certain coils, in response to an unintentional quench in one part of the system. Such operation serves to spread the distribution of energy dissipation during the quench, and helps to avoid damage to the superconducting coils. Such heaters may also be used for switching circuits used for cancelling external field disturbances, flux pumping, and control of system pressure and gas flow.

Figure 1:
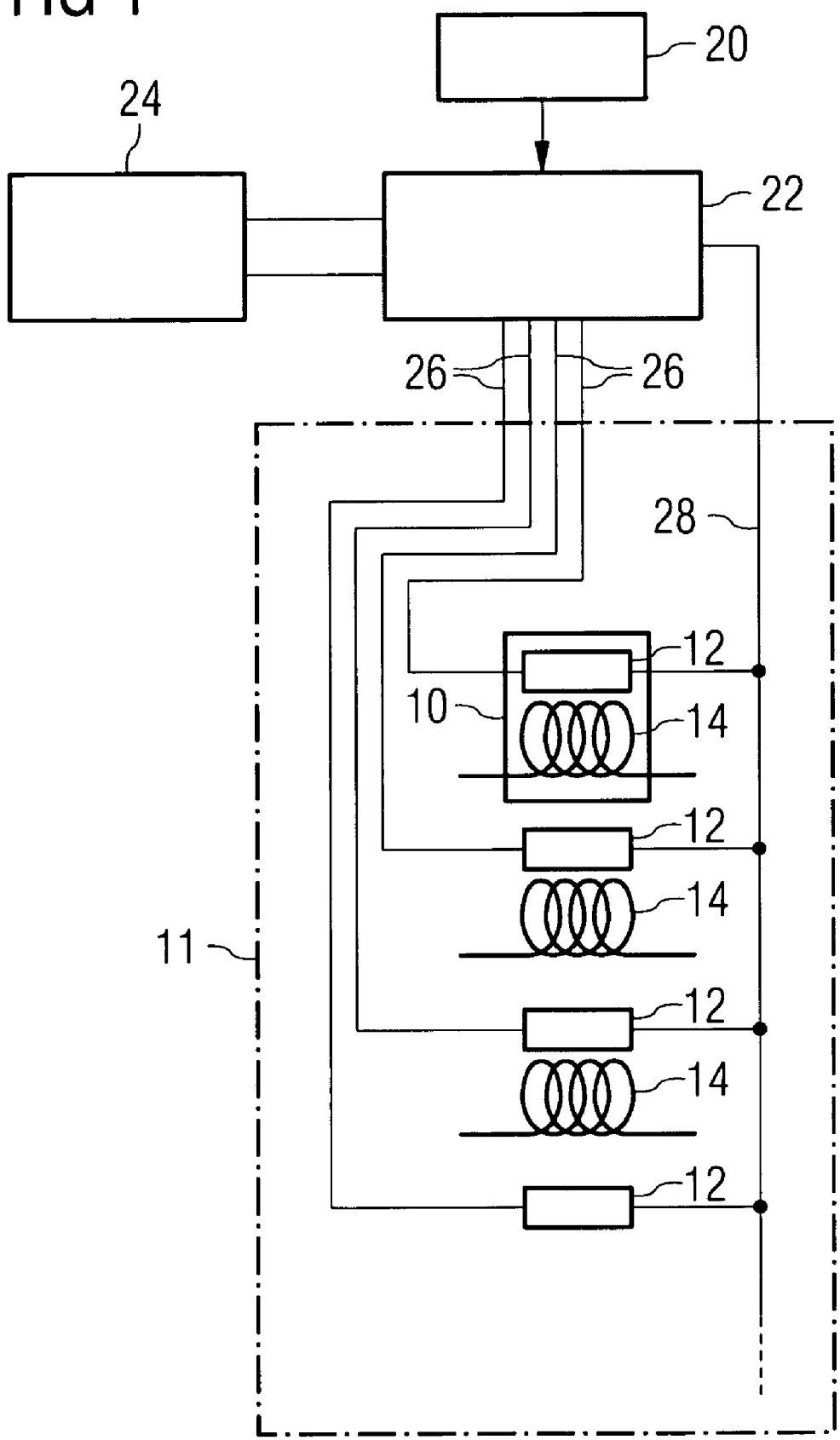

FIG. 1 illustrates a conventional switching circuit for a cryogenic system. A number of cryogenic switches 10 are provided within cryostat 11. Each cryogenic switch 10 comprises a resistive heater 12 thermally linked to a corresponding part of a superconducting component 14. The resistive heater 12 may be a coil of Cu—Ni alloy wire. A control system 20 controls a switching device 22 to apply an electric current from a source 24 to one or more of the resistive heaters 12. As illustrated in the example of FIG. 1, the applied electric current is supplied to each heater 12 by one respective dedicated conductor 26 and one common conductor 28. This arrangement ensures independent control of each heater while reducing the number of wires led into the cryogenic system to a minimum, although arrangements where each heater is provided with two dedicated conductors are also possible. The common conductor 28 may even be provided by the body of a cryostat 11, reducing the numbers of wires required still further.

In a conventional system, such as illustrated in FIG. 1, an electric current, typically a DC current, is applied to a selected resistive heater 12 by switching device 22 under control of control system 20. Each heater 12 must be specifically controlled to operate only when required.

The installation of such conductors 26, 28 for supplying heaters causes certain difficulties. The wires provide a path for thermal influx to the cryogenic system. It may be difficult to achieve a sufficiently gas-tight seal around each wire to prevent leakage of cryogen, or influx of contaminant gas. The installation of the conductors themselves represents an added complexity in the manufacture of the cryogenically cooled system.

The present invention addresses at least some of the drawbacks of the known systems, and accordingly provides apparatus and/or methods as defined in the appended claims.

Figure 2:
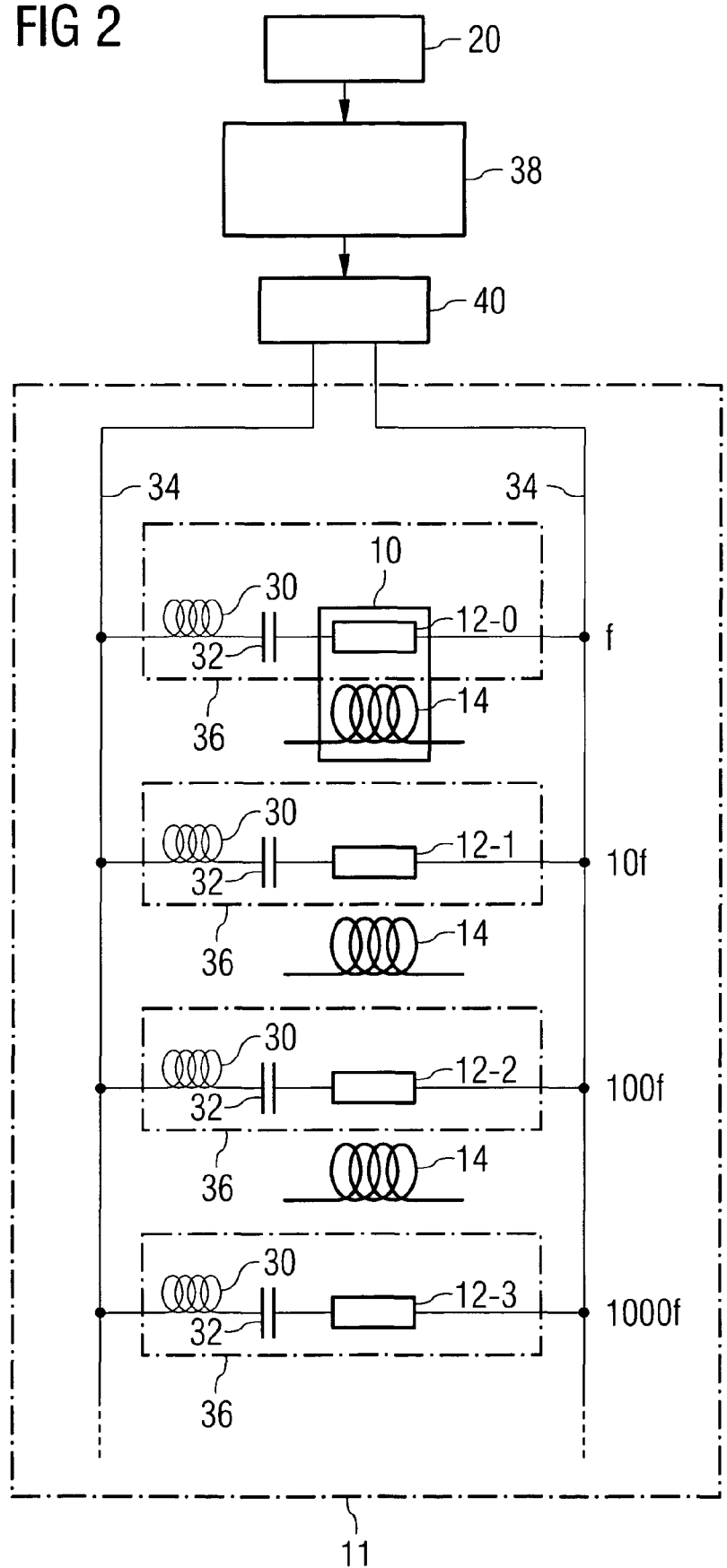

The above, and further, objects, characteristics and advantages of the present invention will become more apparent from the following description of certain embodiments of the invention, given by way of examples only, in conjunction with the accompanying drawings wherein:

FIG. 1 shows an arrangement for controlling a number of heaters within a cryogenically cooled system according to the prior art; and FIG. 2 shows an arrangement for controlling a number of heaters within a cryogenically cooled system according to an embodiment of the present invention.

According to the present invention, a single pair of common conductors 34 is used to control a plurality of heaters within a cryogenic system. FIG. 2 illustrates an embodiment of the present invention. As illustrated, each resistive heater 12 is connected in series with an inductor 30 and a capacitor 32, and this series combination is connected between the two common conductors 34. Each series combination of resistive heater 12, inductor 30 and capacitor 32 forms a tuned circuit 36. The values of the inductor 30 and/or capacitor 32 are different in each respective tuned circuit 36.

In the embodiment of the present invention illustrated in FIG. 2, each tuned circuit is a tuned LCR circuit. A control system 20 controls a frequency generator 38, which provides a signal to an amplifier 40. The amplifier 40 amplifies the signal applied to it by the frequency generator 38 and applies the amplified signal across each of the tuned series LCR circuits.

Each tuned series LCR circuit is resonant at a different frequency. For example, the respective tuned series LCR circuits may be arranged to be resonant at frequencies of f, 10f, 100f, 1000f, and so on, where f is a nominal frequency. This may be arranged by increasing the value of the inductor, or reducing the value of the capacitor, or both, for each subsequent tuned series LCR circuit. Using this example, the corresponding resonant frequencies are indicated adjacent to each corresponding tuned series LCR circuit.

By operating the control system 20 to cause the frequency generator 38 to produce a signal at frequency f, which will be amplified by amplifier 40 and applied to common conductors 34, the corresponding heater 12-0 is activated. The tuned series LCR circuit containing resistive heater 12-0 is tuned to a frequency of f. Since the signal applied to the common conductors 34 is at that frequency, the corresponding tuned series LCR circuit resonates, activating the heater 12-0 and heating the corresponding adjacent part 14 of a superconducting coil. The remaining tuned series LCR circuits are not tuned to that frequency, and they do not resonate, so the associated heaters 12 are not activated.

Similarly, if the control system 20 is operated to cause the frequency generator 38 to produce a signal at frequency 1000f, this will be amplified by amplifier 40 and applied to common conductors 34, the corresponding heater 12-3 will be activated, heating the corresponding adjacent part 14 of a superconducting coil. The remaining tuned series LCR circuits are not tuned to that frequency, and they do not resonate, so the associated heaters 12 are not activated.

Accordingly, it is possible to selectively turn on any one of the heaters 12 by appropriately controlling the frequency of the signal applied to the common conductors 34. Preferably, the frequency generator 38 and amplifier 40 are arranged such that signals of multiple frequencies may be generated and applied to the common conductors 34. For example, if the signal applied to common conductors 34 is composed of frequencies 10f and 100f, then heaters 12-1 and 12-2 will be activated, each heating the corresponding adjacent part 14 of a superconducting coil, while heaters 12-0 and 12-3 remain inactive.

The actual range of frequencies employed may be selected as convenient, and may be defined by the available values of capacitors and inductors. Typically, the activating frequencies will be in the range of 10 Hz to 100 kHz. However, frequencies around 50-60 Hz should be avoided to prevent interference from mains electricity supplies. In systems using an RF field, frequencies close to the frequency of the RF field should also be avoided. The frequencies should be separated as widely as possible to reduce the possibility of heaters being partially activated by signals intended for other heaters.

In certain embodiments of the present invention, the heater may be formed of an inductive coil of resistive wire, for example wire of Cu—Ni alloy. In this way, the resistive heater 12 and the inductor 30 of each tuned series LCR circuit are combined into a single, inductive resistive heater element.

While the embodiment of FIG. 2 shows two common conductors 34 leading into the cryostat to the series tuned LCR circuits, the body of cryostat 11 may be used as one of the common conductors, meaning that only a single conductor need be provided into the cryostat, yet provide control of numerous heaters.

The components 30, 32, 12 used in the tuned circuits must be carefully selected to ensure that they are capable of operation at the required temperatures. For example, in cryostats cooled with liquid helium, the components must be capable of reliable operation at temperatures of 4K. Wire-wound inductors and solid dielectric capacitors should be capable of such operation. The components must also have good quality casings. If, for example, a capacitor casing allowed liquid helium to leak in, it may explode when exposed to higher temperatures, for example when the cryostat is drained for servicing, or when the capacitor heats up in use.

Simple tuned series LCR circuits as shown may require frequency separation by factors of 5× or 10× in order to achieve sufficient discrimination between heating elements. Other filter arrangements may be employed, and may allow smaller frequency separation factors. The filters should, however, be composed of simple passive components.

In a typical superconducting magnet arrangement, up to twelve heaters may be provided. In prior art systems, these would typically require 13 or 24 control wires into the cryostat to enable reliable operation of the heaters. In accordance with the present invention, this may be reduced to two, or even one, wire for equivalent operation. The present invention uses frequency addressing in a novel manner to control heaters in cryogenically cooled apparatus, reducing the number of wires which need to be provided to control the heaters, thereby reducing the complexity of system assembly and reducing heat influx through the control wires. While the present invention has been described with reference to a limited number of particular embodiments, those skilled in the art will recognise that numerous modifications and variations may be made within the scope of the present invention as set out in the appended claims.

The invention claimed is:

1. A switching circuit comprising a plurality of heating elements, each connected as part of one of a plurality of tuned circuits, the tuned circuits being respectively tuned to different frequencies and connected in parallel between two common conductors, the switching circuit further comprising means for applying an oscillating signal voltage between the two common conductors, at one or more frequencies each corresponding to a tuned frequency of one of the tuned circuits.

2. A switching circuit according to claim 1, wherein each of the tuned circuits comprises a resistive heating element in series with a capacitor and an inductor.

3. A switching circuit according to claim 1, wherein each of the tuned circuits comprises a resistive, inductive heating element in the form of an inductive coil of resistive wire, connected in series with a capacitor.

4. A switching circuit according to claim 1, wherein the means for applying an oscillating voltage comprises a control system arranged to control a frequency generator to generate a signal at the one or more frequencies.

5. A switching circuit according to claim 4, wherein the means for applying an oscillating voltage further comprises an amplifier arranged to receive the signal at one or more frequencies from the frequency generator, to amplify said signal and to apply such amplified signal between the common conductors.

6. A cryostat housing superconducting components and a number of heaters, at least some of said heaters being each thermally linked to a corresponding part of a superconducting component, said heaters forming part of a switching circuit, each of said heaters being connected as part of one of a plurality of tuned circuits, the tuned circuits being respectively tuned to different frequencies and connected in parallel between two common conductors, the switching circuit comprising means for applying an oscillating signal voltage between the two common conductors, at one or more frequencies each corresponding to a tuned frequency of one of the tuned circuits, wherein the tuned circuits are located within the cryostat, while the means for applying the oscillating signal voltage are placed outside of the cryostat.

7. A cryostat according to claim 6 wherein one of the common conductors is composed of a body of the cryostat.

* * * * *